United States Patent

Shih et al.

[11] Patent Number: 6,080,656
[45] Date of Patent: Jun. 27, 2000

[54] METHOD FOR FORMING A SELF-ALIGNED COPPER STRUCTURE WITH IMPROVED PLANARITY

[75] Inventors: Tsu Shih, Hsin-Chu; Ying-Ho Chen, Taipei; Jih-Churng Twu, Chung Ho; Syun-Ming Jang, Hsin-Chu, all of Taiwan

[73] Assignee: Taiwan Semiconductor Manufacturing Company, Hsin-Chu, Taiwan

[21] Appl. No.: 09/387,436

[22] Filed: Sep. 1, 1999

[51] Int. Cl.[7] .......................... H01L 21/4763; H01L 21/44
[52] U.S. Cl. ..................... 438/626; 438/625; 438/631; 438/641; 438/642; 438/645; 438/697; 438/687; 257/762; 257/763
[58] Field of Search ........................ 438/622, 625, 438/626, 629, 631, 634, 640, 641, 642, 645, 687, 688, 694, 697, 754, 628, 644, 643; 257/762, 763

[56] References Cited

U.S. PATENT DOCUMENTS

| | | | |
|---|---|---|---|
| 5,011,580 | 4/1991 | Pan et al. | 204/15 |
| 5,071,518 | 12/1991 | Pan | 205/122 |
| 5,242,861 | 9/1993 | Inaba | 437/190 |
| 5,266,526 | 11/1993 | Aoyama et al. | 437/195 |
| 5,723,387 | 3/1998 | Chem | 438/692 |
| 5,766,492 | 6/1998 | Sadahisa et al. | 216/16 |
| 5,821,168 | 10/1998 | Jain | 438/692 |
| 5,968,333 | 10/1999 | Nogami et al. | 205/184 |
| 5,969,422 | 10/1999 | Ting et al. | 257/762 |

*Primary Examiner*—Charles Bowers
*Assistant Examiner*—Thanhha Pham
*Attorney, Agent, or Firm*—George O. Saile; Stephen B. Ackerman; William J. Stoffel

[57] ABSTRACT

A method for forming a copper structure with reduced dishing, using a self-aligned copper electroplating process. The process begins by providing a semiconductor structure having a dielectric layer thereover, wherein the dielectric layer has a trench therein. A barrier layer is formed over the dielectric layer, a seed layer is formed on the barrier layer, and an insulating layer is formed on the seed layer. The insulating layer is patterned so as to expose the seed layer on the bottom and sidewalls of the trench, preferably using the trench photo mask. A copper layer is selectively electroplated onto the exposed seed layer on the bottom and sidewalls of the trench, while the insulating layer prevents copper deposition outside of the trench. The copper layer, the insulating layer, and the seed layer are planarized, stopping at the dielectric layer. Because of the self-aligned copper geometry, the copper suffers reduced dishing.

14 Claims, 2 Drawing Sheets

//6,080,656//

METHOD FOR FORMING A SELF-ALIGNED COPPER STRUCTURE WITH IMPROVED PLANARITY

BACKGROUND OF INVENTION

1) Field of the Invention

This invention relates generally to fabrication of a semiconductor device and more particularly to a method for forming a copper structure, such as word lines, bit lines and interconnections with reduced erosion (dishing) and copper residue from chemical-mechanical polishing (CMP) by using a self-aligned copper deposition process.

2) Description of the Prior Art

Integrated circuits continue to increase in complexity each year. As applications develop for memories, microprocessors, and minicomputers there is an increasing demand for greater microminiturization, greater switching speeds, and smaller and less costly integrated circuit semiconductor devices.

Increased device microminiturization improves device performance and packing density while reducing cost per unit. However, microminiturization reduces yield and reliability, and degrades interconnect performance and noise margins.

Continued microminiturization of semiconductor devices using non-scaling aluminum lines would require the use of more metal layers, multi-level interconnections, and global planarization. The use of copper for interconnect and line metallurgy has long been considered as a possible alternative metallization material to aluminum and aluminum alloys due to its low resistivity and ability to reliably carry high current densities. However, its use has presented many manufacturing problems, such as the possibility of diffusion into the semiconductor substrate, the low adhesive strength of copper to various dielectric materials, and the difficulty in planarizing a copper layer without erosion or dishing occuring which reduces the performance and impedes the ability to stack multiple layers.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,011,580 (Pan et al.) discloses a copper plating process where a photoresist layer is used as a mask to form copper lines/interconnects during a rework process. However, this patent does not disclose or suggest planarizing the copper structures.

U.S. Pat. No. 5,242,861 (Inaba) and U.S. Pat. No. 5,071,518 (Pan) show methods for using photoresist as masks for electroplating copper lines.

U.S. Pat. No. 5,266,526 (Aoyama et al.) discloses a selective copper electroless plating process forming a copper interconnect in a trench.

U.S. Pat. No. 5,723,387 (Chen) and U.S. Pat. No. 5,821,168 (Jain) disclose dual damascene copper plating processes.

U.S. Pat. No. 5,766,492 (Sadahisa et al.) discloses a copper plating process for a printed circuit board using photoresist.

SUMMARY OF THE INVENTION

It is an object of the present invention to provide a method for forming a copper structure with reduced dishing effect.

It is another object of the present invention to provide a method for forming a copper structure with improved Rs uniformity.

It is another object of the present invention to provide a method for forming a copper structure which is compatible with multi-layer architecture.

It is yet another object of the present invention to provide a producible and economical method for forming copper interconnects and lines in tenches in a dielectric layer using a self-aligned copper electroplating process.

To accomplish the above objectives, the present invention provides a method for forming a copper structure with reduced dishing, using a self-aligned copper electroplating process. The process begins by providing a semiconductor structure having a dielectric layer thereover, wherein the dielectric layer has a trench therein. A barrier layer is formed over the dielectric layer, a seed layer is formed over the barrier layer, and an insulating layer is formed on the seed layer. The insulating layer is patterned so as to expose the seed layer on the bottom and sidewalls of the trench. A copper layer is selectively electroplated onto the exposed seed layer on the bottom and sidewalls of the trench, while the insulating layer prevents copper deposition outside of the trench. The copper layer, the insulating layer, the seed layer, and the barrier layer are planarized, stopping at the dielectric layer.

The present invention provides considerable improvement over the prior art. Because of the self-aligned copper geometry, the copper suffers reduced dishing. Copper lines and interconnects with reduced dishing provide improved Rs uniformity. Copper lines and interconnects with reduced dishing also provide the improved planarization needed to form the multilevel metalization demanded for current devices.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming copper structures for semiconductor devices in a trench, according to the present invention, which do not suffer the dishing problem during planarization.

Figure 1:
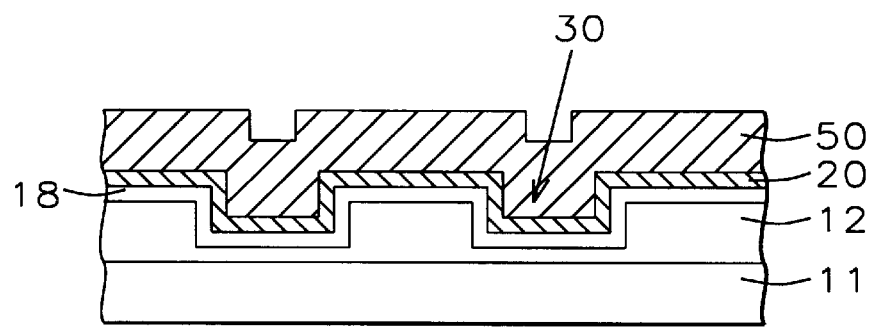
FIGS. 1 & 2 illustrate sequential sectional views of a process known to the inventors for forming copper structures in a trench which suffers a dishing problem during planarization.
Figure 2:
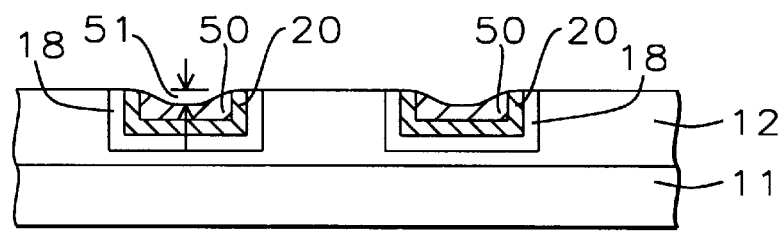

Problem Identified by the Inventors—FIGS. 1 & 2

The inventors have identified a problem in a process known to them for forming copper structures such as lines and interconnects for a semiconductor device in a trench formed in a dielectric layer. The problem identified by the inventors is that as the trench width increases, dishing will occur in the copper structure causing Rs uniformity issues and planarity problems which make multiple layers of copper structures difficult. The problem process is described with reference to FIGS. 1 & 2.

Referring to FIG. 1, the problem process known to the inventors begins by providing a semiconductor structure (11) having a dielectric trench layer (12) thereover, wherein the dielectric layer has one or more trenches (30) formed therein.

Semiconductor structure (11) is understood to possibly include a substrate consisting of a semiconducting material such as monocrystalline silicon or germanium or a silicon on insulator (SOI) structure as is known in the art. Semiconductor structure (11) is understood to possibly further include conductive layers and/or insulating layers formed over a substrate or the like, and passive and or active devices formed over and/or in the substrate or the like.

The trenches (30) preferably have a depth of between about 4000 Angstroms and 20000 Angstroms and a width of between about 0.2 microns and 2000 microns.

A barrier layer (18) is formed over the dielectric trench layer (12) and in the trenches (30), and a seed layer (20) is formed on the barrier layer (18). The barrier layer (18) is preferably composed of tantalum nitride (TaN), having a thickness of between about 50 Angstroms and 600 Angstroms. The seed layer (20) can be comprised of any of a number of conductive materials, most preferably aluminum. The seed layer preferably has a thickness of between about 1000 Angstroms and 3000 Angstroms, and can be formed using a chemical vapor deposition process or a sputtering process.

A copper layer (50) is formed on the seed layer (20) using an electroplating process, having a sufficient thickness such that the trenches (30) are completely filled.

The copper layer (50) and the seed layer (20) are then planarized using a chemical-mechanical polishing process (CMP), stopping on the dielectric layer (12). However, the top surface of the copper in the center of the trench is lower than the top surface of the copper at the edge of the trench by a distance (51) of between about 500 Angstroms and 3000 Angstroms for a trench width of 100 microns. This condition is known as dishing, and can cause Rs uniformity and planarity problems.

Preferred Embodiment of the Present Invention—FIGS. 3 through 6

Figure 3:
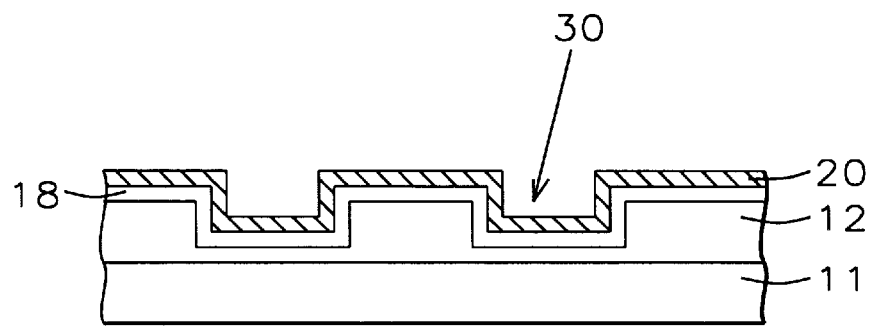
FIGS. 3, 4, 5 & 6 illustrate sequential sectional views of a process for forming copper structures for semiconductor devices in a trench, according to the present invention, which does not suffer the dishing problem during planarization.

Referring to FIG. 3, the preferred embodiment of the present invention begins by providing a semiconductor structure (11) having a dielectric layer (12) thereover, wherein one or more trenches (30) are formed in the dielectric layer, as in the problem process. The trenches (30) can extend all the way through the dielectric layer (12) to expose a conductive area (e.g. another conductive line or a doped area of an underlying substrate). The dielectric layer can be an inter level dielectric (ILD) or an inter metal dielectric (IMD).

As in the problem process, a barrier layer (18) is formed over the dielectric trench layer (12), and a seed layer (20) is formed on the barrier layer (18). The barrier layer (18) is preferably composed of tantalum nitride having a thickness of between about 50 Angstroms and 600 Angstroms. The seed layer (20) preferably is comprised of seed copper having a thickness of between about 1000 Angstroms and 3000 Angstroms. The seed layer can be composed of physical vapor deposited (e.g. sputtered) copper or chemical vapor deposited copper.

Figure 4:
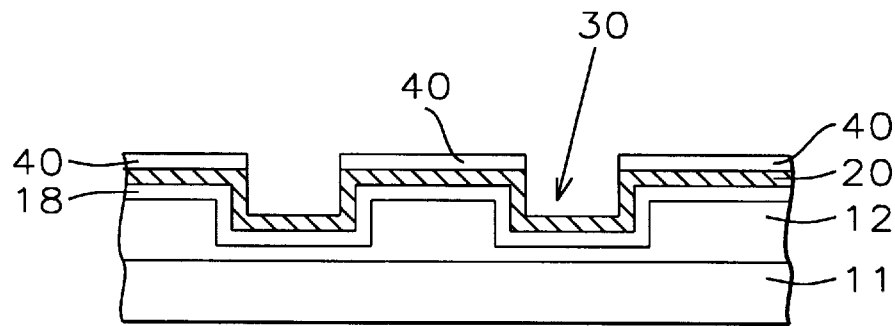

Referring to FIG. 4, an insulating layer (40) is formed on the seed layer (20). The insulating layer (40) can be comprised of any of a number of electrically insulating materials such as silicon dioxide; silicon nitride; silicon oxynitride; a low-K dielectric material such as Silk, Flare, or black diamond; photoresist; or BARC. The insulating layer preferably has a thickness of between about 100 Angstroms and 1000 Angstroms.

Still referring to FIG. 4, the insulating layer (40) is patterned such that it is removed from the sidewalls and bottom of the trenches (30). The insulating layer can be patterned using photolithography (e.g. photoresist, expose, develop, etch) with the same photo mask as was used to pattern the trenches (30).

Figure 5:
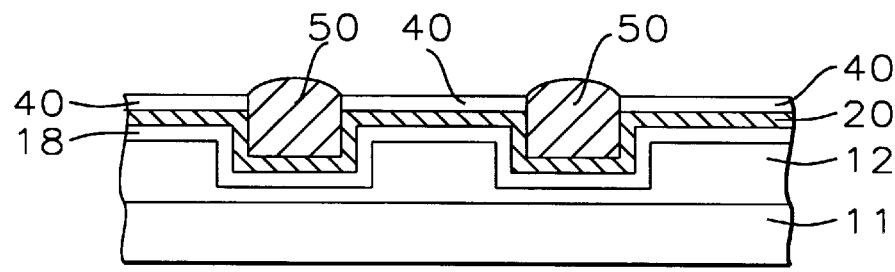

Referring to FIG. 5, a copper layer (50) is electrochemically deposited (ECD) onto the sidewalls and bottoms of the trenches (30) where the insulating layer (40) has been removed and the seed layer (20) is exposed. The copper layer (50) can not form where the insulating layer (40) remains, because electrical current is required for electroplating, and no current flows through the insulating layer (40). ECD can be performed using a AMAT Novellus semi-tool.

A key advantage of the present invention is that copper will readily adhere to the copper which has already been deposited by ECD causing the copper layer (50) to extend above the top surfaces of the adjacent seed layer (20) and insulating layer (40). This raised copper profile is particularly beneficial during subsequent planarization steps.

Figure 6:
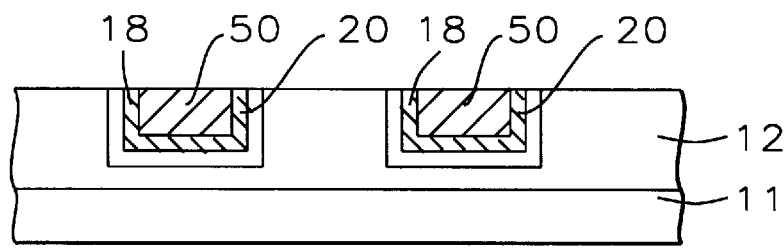

Referring to FIG. 6, the copper layer (50), the insulating layer (40), the seed layer (20), and the barrier layer (18) are planarized, stopping at the top surface of the dielectric trench layer (12). The planarization process is preferrably a chemical-mechanical polishing process (CMP) performed for a time of between about 30 seconds and 600 seconds, and stopped using an end-point detection mode. Due to the copper profile formed by selective electroplating, the copper layer (50) is planar with the top surface of the dielectric layer (12) within 1000 Angstroms to 3000 Angstroms prior to CMP and within 500 Angstroms following CMP.

The invention eliminates dishing because only a short CMP is required due to the selective plating. While the invention has been particularly shown and described with reference to the preferred embodiments thereof, it will be understood by those skilled in the art that various changes in form and details may be made without departing from the spirit and scope of the invention. Also, it should be understood that copper layer (50) can function as a contact, interconnect, or conductive line. Dielectric layer (12) can be an inter-level dielectric (ILD) layer or an inter-metal dielectric layer (IMD).

What is claimed is:

1. A method for forming a copper structure with reduced dishing, comprising the steps of:
   a. providing a semiconductor structure having a dielectric layer thereover; said dielectric layer having a trench therein; said trench having a bottom and sidewalls;
   b. forming a barrier layer over said dielectric layer, and forming a seed layer on said barrier layer;
   c. forming an insulating layer on said seed layer;
   d. patterning said insulating layer; thereby exposing said seed layer on said bottom and sidewalls of said trench;

e. selectively electro-chemically depositing a copper layer onto said seed layer on said bottom and said sidewalls of said trench; and f. planarizing said copper layer, said insulating layer, said seed layer, and said barrier layer stopping at said dielectric layer.

2. The method of claim 1 wherein said barrier layer is comprised of tantalum nitride having a thickness of between about 50 Angstroms and 600 Angstroms, and said seed layer is comprised of physical vapor deposited copper having a thickness of between about 1000 Angstroms and 3000 Angstroms.

3. The method of claim 1 wherein said insulating layer comprises silicon dioxide, silicon nitride, silicon oxynitride, a low-K dielectric, photoresist, or BARC and has a thickness of between about 100 Angstroms and 1000 Angstroms.

4. The method of claim 2 wherein said insulating layer comprises silicon dioxide, silicon nitride, silicon oxynitride, a low-K dielectric, photoresist, or BARC and has a thickness of between about 100 Angstroms and 1000 Angstroms.

5. The method of claim 1 wherein said copper layer, said insulating layer, said seed layer, and said barrier layer are planarized using a chemical-mechanical polishing process stopping on said dielectric layer using an end-point detection mode.

6. The method of claim 4 wherein said copper layer, said insulating layer, said seed layer, and said barrier layer are planarized using a chemical-mechanical polishing process stopping on said dielectric layer using an end-point detection mode.

7. The method of claim 1 wherein said copper layer has a sufficient thickness to extend above the top surface of said insulating layer by a distance of between about 1000 Angstroms and 3000 Angstroms prior to planarization, and is planar with the top surface of said dielectric layer within 500 Angstroms following planarization.

8. A method for forming a copper structure in a trench in a dielectric layer over a semiconductor structure, comprising the steps of:

a. providing a semiconductor structure having a dielectric layer thereover; said dielectric layer having a trench therein; said trench having a bottom and sidewalls;

b. forming a barrier layer over said dielectric layer, and a seed layer on said barrier layer; said barrier layer having a thickness of between about 50 Angstroms and 600 Angstroms, and said seed layer having a thickness of between about 1000 Angstroms and 3000 Angstroms;

c. forming an insulating layer on said seed layer; said insulating layer having a thickness of between about 100 Angstroms and 1000 Angstroms;

d. patterning said insulating layer; thereby exposing said seed layer on said bottom and said sidewalls of said trench;

e. selectively electro-chemically depositing a copper layer onto said seed layer on said bottom and said sidewalls of said trench; said copper layer having a sufficient thickness such that it extends above the top surface of said insulating layer by a distance of between about 1000 Angstroms and 3000 Angstroms; and f. chemical-mechanical polishing said copper layer, said insulating layer, said seed layer, and said barrier layer stopping at said dielectric layer; thereby providing a copper structure in said trench in said dielectric layer having improved planarity.

9. The method of claim 8 wherein said copper layer is planar with the top surface of said dielectric layer within 500 Angstroms in a trench having a width of between about 0.2 microns and 1000 microns, following chemical-mechanical polishing.

10. The method of claim 8 wherein said seed layer is patterned by photolithography and etching, using a photo mask which was used to form said trenches.

11. The method of claim 8 wherein said barrier layer is comprised of tantalum nitride, and said seed layer is comprised of physical vapor deposited copper.

12. The method of claim 9 wherein said barrier layer is comprised of tantalum nitride, and said seed layer is comprised of physical vapor deposited copper.

13. The method of claim 8 wherein said insulating layer comprises silicon dioxide, silicon nitride, silicon oxynitride, a low-K dielectric, photoresist, or BARC.

14. The method of claim 12 wherein said insulating layer comprises silicon dioxide, silicon nitride, silicon oxynitride, a low-K dielectric, photoresist, or BARC.

* * * * *